(12) United States Patent
Huang

(10) Patent No.: US 7,889,506 B2
(45) Date of Patent: Feb. 15, 2011

(54) FUNCTION EXPANSION DATACARD

(75) Inventor: Cheng-Hsing Huang, Taipei (TW)

(73) Assignee: Inventec Corporation, Taipei (TW)

( * ) Notice: Subject to any disclaimer, the term of this patent is extended or adjusted under 35 U.S.C. 154(b) by 451 days.

(21) Appl. No.: 12/068,383

(22) Filed: Feb. 6, 2008

(65) Prior Publication Data
US 2008/0316719 A1  Dec. 25, 2008

(30) Foreign Application Priority Data
Jun. 25, 2007  (TW) ............................... 96122964 A

(51) Int. Cl.
*H05K 1/14* (2006.01)
(52) U.S. Cl. ........................ 361/737; 361/800; 361/790
(58) Field of Classification Search ................. 361/752, 361/790, 797, 800, 730, 600, 728, 736, 737, 361/679; 439/55, 59, 61, 74, 76.1
See application file for complete search history.

(56) References Cited

U.S. PATENT DOCUMENTS

| | | | |
|---|---|---|---|
| 6,035,216 A * | 3/2000 | Cheng et al. | 455/558 |
| 6,173,405 B1 * | 1/2001 | Nagel | 726/21 |
| 7,048,558 B2 * | 5/2006 | Fan | 439/157 |
| 7,081,020 B1 * | 7/2006 | Lee | 439/630 |
| 7,233,489 B2 * | 6/2007 | Toyama et al. | 361/679.31 |
| 2005/0114584 A1 * | 5/2005 | Chen | 710/313 |
| 2006/0085800 A1 * | 4/2006 | Chiu | 720/600 |

* cited by examiner

*Primary Examiner*—Hung S Bui
(74) *Attorney, Agent, or Firm*—Bacon & Thomas, PLLC

(57) ABSTRACT

A function expansion datacard including a main board, a connector, a housing and a holder is provided. Several chips and the connector are disposed on a surface of the main board. The connector is situated near the edge of the main board. The housing disposed on the main board covers the chips and exposes a connection surface of the connector. The holder movably disposed at the housing is moved in and out the housing. The holder is situated over the connector and moves in a direction perpendicular to the connection surface.

9 Claims, 3 Drawing Sheets

100'

ND DATACARD

This application claims the benefit of Taiwan application Serial No. 96122964, filed Jun. 25, 2007, the subject matter of which is incorporated herein by reference.

BACKGROUND OF THE INVENTION

1. Field of the Invention

The invention relates in general to a function expansion datacard, and more particularly to a function expansion datacard used in an electronic apparatus.

2. Description of the Related Art

In recent years, the technology of portable electronic apparatus has made great advance. The size and the weight continue to be reduced, and yet the functions are expanded and integrated further. However, as an electronic apparatus has only a limited internal space, an electronic apparatus is unable to incorporate all different functions or make the functions of an electronic apparatus customerized. Therefore, the electronic apparatuses currently available on the market normally have one or more than one expansion slot for the user to plug an expansion card into so as to provide the electronic apparatus with additional functions such as playing a digital TV program, providing wireless communication or expanding the memory capacity of the electronic apparatus. Expansion cards of various specifications such as secure digital (SD) card, PC card and compact flash (CF) card have been provided to utilize in various electronic apparatuses.

The CF card, having the advantages of high data transmission rate and large storage capacity, has been applied as a flash memory medium and utilized in many applications such as modem, network interface, wireless network communication, Bluetooth adaptor, and graphic processor. Therefore, the CF card is now widely used in various portable electronic apparatuses. However, as the functions of applications are getting more and more complicated, more and more chips and circuits need to be integrated into the limited space of the CF card. Thus, it is getting increasingly difficult to add new functions in the design of a novel CF card. For example, in a CF card used as a modulator-demodulator, normally several chips of different functions as well as the chips used for connecting a mobile network are disposed on the main board. Meanwhile, the connector of the CF card is also disposed on the main board. As all the elements are disposed on the main board at the same time, it largely limits the utilization of the area on the main board as well as the potential in function development of the CF card.

SUMMARY OF THE INVENTION

The invention is directed to a function expansion datacard. The holder is disposed over a connector, so that the space occupied by the holder inside the function expansion datacard is reduced, the area of internal circuit layout of the function expansion datacard is increased, and the internal space of the function expansion datacard is used more efficiently.

According to the present invention, a function expansion datacard including a main board, a connector, a housing and a holder is provided. Several chips and the connector are disposed on a surface of the main board. The connector is situated near the edge of the main board. The housing that is disposed on the main board covers the chips and exposes a connection surface of the connector. The holder movably disposed at the housing is moved in and out the housing. The holder is situated over the connector and moves in a direction perpendicular to the connection surface.

The invention will become apparent from the following detailed description of the preferred but non-limiting embodiments. The following description is made with reference to the accompanying drawings.

DETAILED DESCRIPTION OF THE INVENTION

A preferred embodiment of the invention is disclosed below. The preferred embodiment is for elaboration purpose only and is not for limiting the scope of protection of the invention. In addition, unnecessary elements are omitted in the preferred embodiment for highlighting the technical features of the invention.

Figure 1:
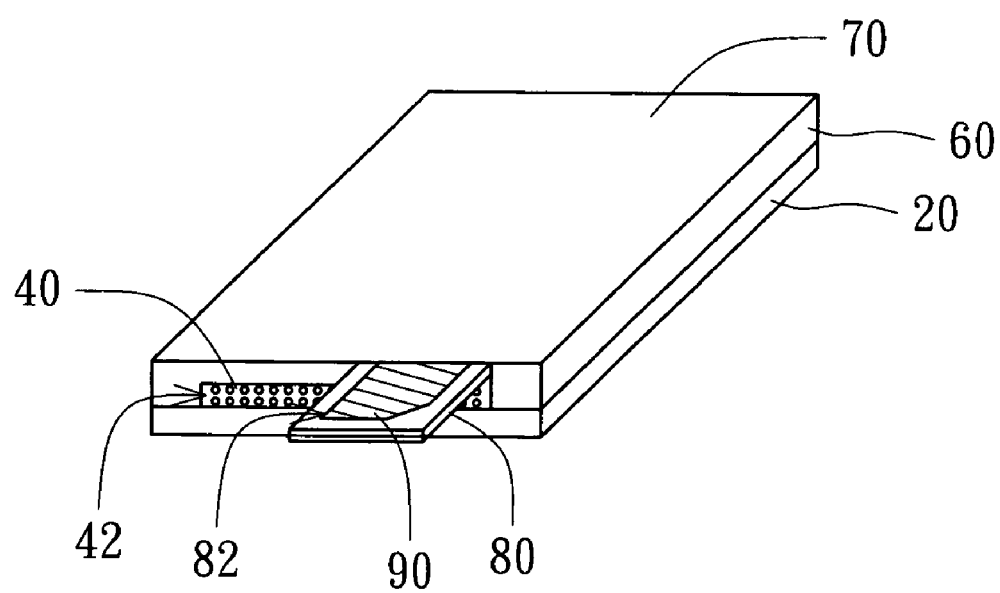
FIG. 1 is a 3-D perspective of a function expansion datacard according to a preferred embodiment of the invention.
Figure 2:
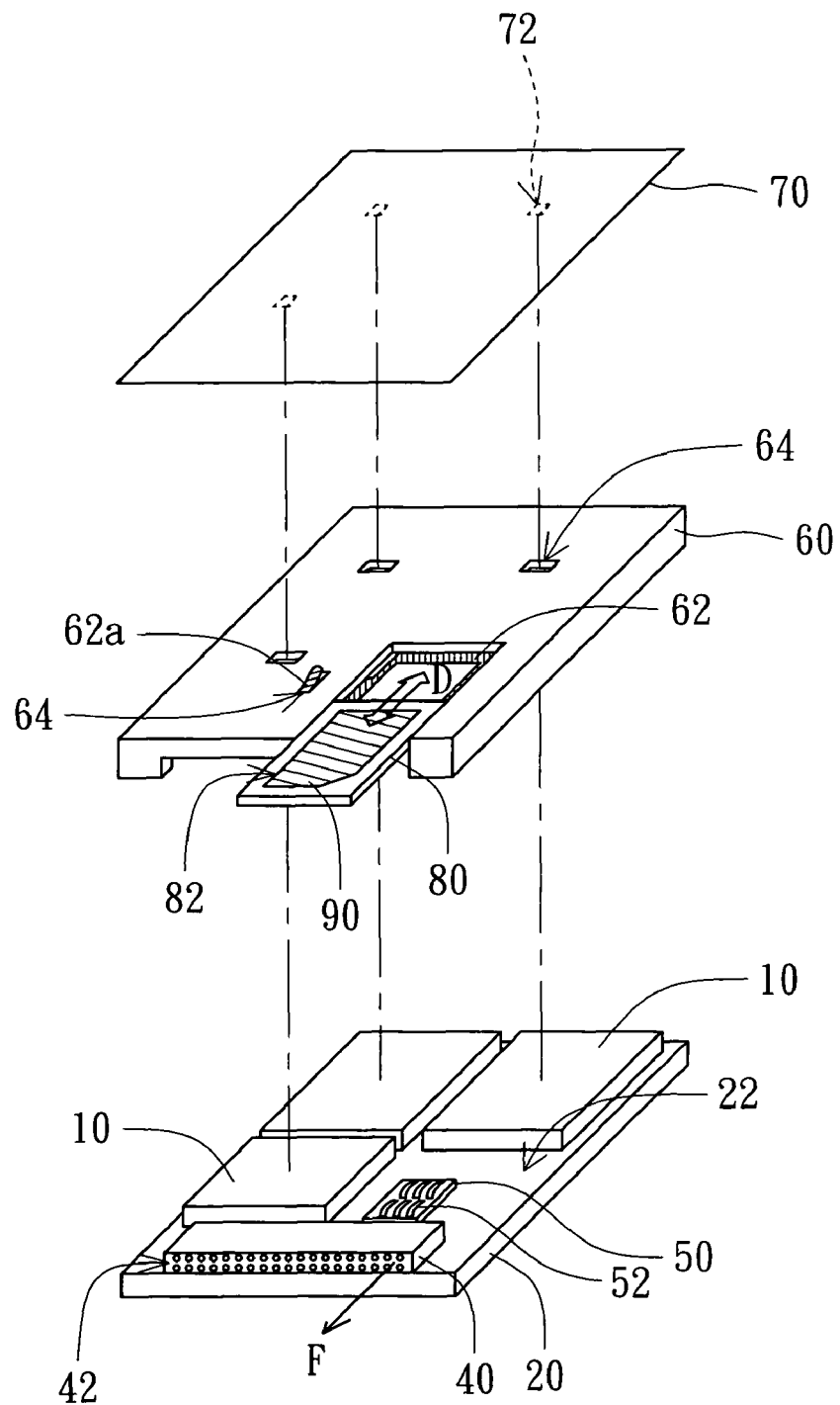
FIG. 2 is an exploded diagram of the function expansion datacard in FIG. 1.

Referring to both FIG. 1 and FIG. 2, FIG. 1 is a 3-D perspective of a function expansion datacard according to a preferred embodiment of the invention. FIG. 2 is an exploded diagram of the function expansion datacard in FIG. 1. The function expansion datacard 100 includes a main board 20, a connector 40, a housing 60 and a holder 80. Several chips 10 are disposed on a surface 22 of the main board 20. The connector 40 is disposed on the surface 21 and situated at an edge of the main board 20. The housing 60 that is disposed on the main board 20 covers the chips 10 and exposes a connection surface 42 of the connector 40. The holder 80 is movably disposed at the housing 60 and is moved in and out the housing 60. The holder 80 is disposed above the connector 40. The holder 80 moves in a direction D perpendicular to the connection surface 42, that is, the direction D being parallel to the normal direction F of the connection surface 42. Thus, the holder 80 is stacked over the connector 40, and the area of the holder 80 on the main board 20 is reduced. Therefore, without increasing the overall size of the function expansion datacard, the area for circuit layout on the main board 20 is used more efficiently.

The function expansion datacard 100 further includes a contact structure 50 and a board 70. The housing 60 having several contact holes 64 further includes a metal bracket 62. The holder 80 has a slot 82 for receiving a subscriber identity module (SIM) card 90. The shape of the slot 82 preferably corresponds to that of the SIM card 90 to assure that the SIM card 90 is placed in the slot 82 correctly. The contact structure 50 is disposed on the surface 22 of the main board 20. When the holder 80 situates inside the housing 60, the SIM card 90 is substantially disposed above where the contact structure 50 is. Meanwhile, the contact structure 50 contacts the SIM card 90 by several contact elastic pieces 52 so that the SIM card 90 is electrically connected with the main board 20. The metal bracket 62 and the housing 60 are formed through insert molding. When the housing 60 is formed, the housing 60 tightly encapsulates a portion of the metal bracket 62, so that the metal bracket 62 is firmly embedded into the housing 60 and that the metal bracket 62 can be provided with sufficient supporting strength. Besides, the insert molding method effectively reduces the overall thickness of the housing 60 and the metal bracket 62. The metal bracket 62 is for supporting the holder 80 and the SIM card 90. The metal bracket 62 is substantially disposed corresponding to the SIM card 90 when the holder 80 situates inside the housing 60. The holder 80 and the SIM card 90 are supported by the metal bracket 62 then, and the required supporting strength between the holder 80 and the housing 60 can be reduced. Thus, the holder 80 can be connected to the housing 60 by a simple sliding and positioning mechanism, and the required height of the holder 80 is reduced. In the present embodiment of the invention, the thickness of the holder 80 can simply be slightly higher than the SIM card 90. Therefore, without affecting the overall height of the function expansion datacard 100, the holder 80 can be stacked over the connector 40.

Moreover, the board 70, with several pads 72 thereon, is disposed on the housing 60, and the pads 72 go through the contact holes 64 respectively, so that the chips 10 are electrically connected with the board 70. The metal bracket 62 has a pin 62a electrically contacting the board 70 through the corresponding contact holes 64. In the present embodiment of the invention, the board 70, preferably embodied by a thin metal plate, is used as a grounding board of the function expansion datacard 100 for grounding the chips 10 and the metal bracket 62. Besides, the metal bracket 62 is preferably disposed under the holder 80. As the metal bracket 62 is grounded through the board 70, the metal bracket is also able to shield the SIM card 90. While the function expansion datacard 100 is operating, the metal bracket 62 shields the electromagnetic interference (EMI) generated by the main board 20 or the chips 10, hence assuring the stability of SIM card 90.

Figure 3:
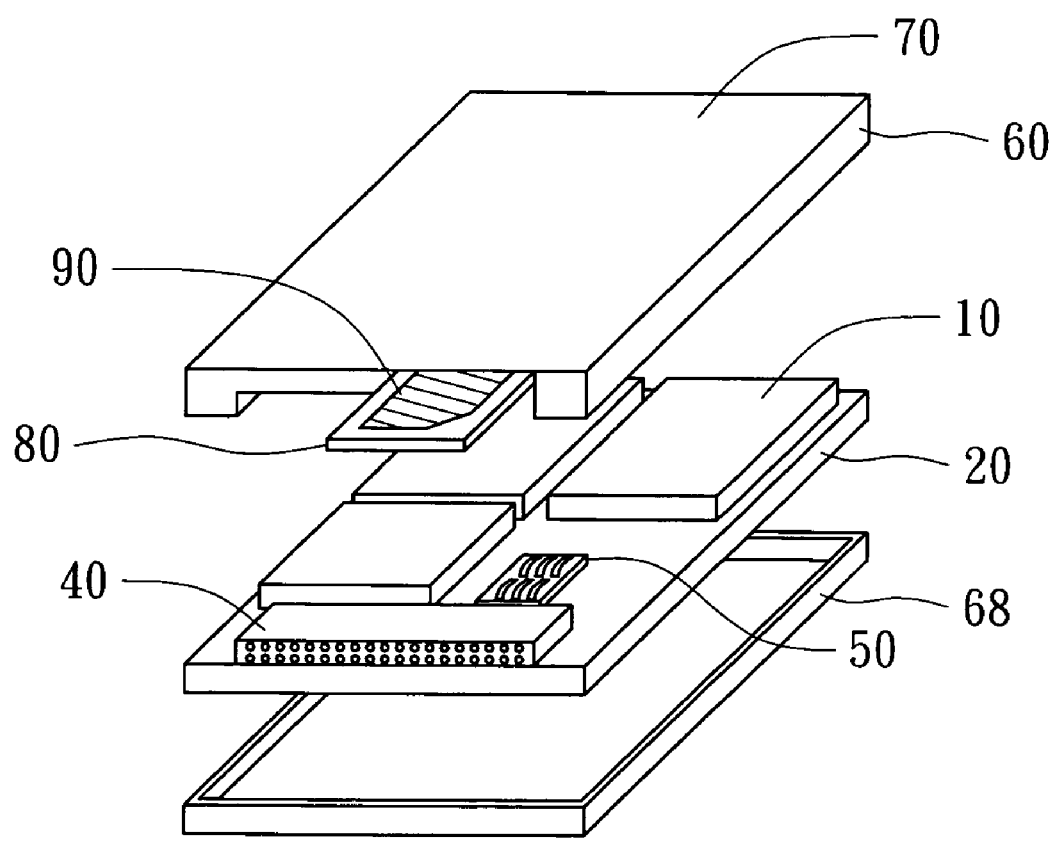
FIG. 3 is a perspective of a function expansion datacard with a bottom housing.

Besides, the function expansion datacard 100 can further include a bottom housing 68 incorporated with the housing 60. Referring to FIG. 3, a perspective of a function expansion datacard with a bottom housing is shown. In the function expansion datacard 100', the main board 20, the chips 10, the contact structure 50 and the connector 40 are disposed in the space formed between the bottom housing 68 and the housing 60 for protecting the main board 20 and the elements disposed on the surfaces thereof. The chips 10 and the metal bracket 62 (illustrated in FIG. 2) can be grounded through the board 70 or the board disposed on the bottom of the bottom housing 68 (not illustrated).

In the present embodiment of the invention, the function expansion datacard 100 is exemplified by a modulator-demodulator (MODEM) complying complying with the compact flash type II specification. When the function expansion datacard 100 is installed into an electronic apparatus (not illustrated), by way of connecting to a mobile communication network through the function expansion datacard 100, the electronic apparatus can then transmit data through wireless communication. The function expansion datacard 100 is electrically connected to the electronic apparatus through the connector 40 for transmitting data. Examples of the electronic apparatus include a personal digital assistant (PDA), a palm-sized computer, a notebook and a smart phone.

According to the function expansion datacard disclosed in the above-preferred embodiment of the invention, the holder is movably disposed at the housing and is moved in and out the housing. The holder is situated over the connector and moves in a direction perpendicular to a connection surface of the connector. As the holder is stacked over the connector, the area of the holder and the connector together disposed on the main board is reduced. As a result, the area for circuit layout on the main board is increased, and the internal space of the function expansion datacard is used more efficiently. Besides, by using the board as a grounding board, several chips and the metal bracket are grounded directly without using any additional grounding elements, not only saving cost but also reducing the noise during the operation of the function expansion datacard, thus increasing the quality of the function expansion datacard. Moreover, as the SIM card is shielded by the metal bracket, the stable operation of the SIM card is guaranteed and product reliability is further improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation to encompass all such modifications and similar arrangements and procedures.

What is claimed is:

1. A function expansion datacard, comprising:
   a main board having one surface, wherein a plurality of chips are disposed thereon;
   a connector disposed on the surface and situated at an edge of the main board;
   a housing disposed on the main board, wherein the housing covers the chips and exposes a connection surface of the connector; and
   a holder movably disposed at the housing and situated over the connector, wherein the holder is moved in and out the housing;
   wherein the holder moves in a direction perpendicular to the connection surface.

2. The function expansion datacard according to claim 1, wherein the holder has a slot for placing a subscriber identity module (SIM) card and the function expansion datacard further comprises:
   a contact structure disposed on the surface, wherein when the holder situates inside the housing, the SIM card is substantially disposed above where the contact structure is.

3. The function expansion card according to claim 2, wherein the contact structure contacts the SIM card when the holder situates inside the housing, so that the SIM card is electrically connected with the main board.

4. The function expansion datacard according to claim 2, wherein the housing further comprises:
   a metal bracket for supporting the holder and the SIM card, wherein the metal bracket is substantially disposed corresponding to the SIM card when the holder situates inside the housing.

5. The function expansion datacard according to claim 4, wherein the housing and the metal bracket are formed integrally through insert molding.

6. The function expansion datacard according to claim 4, wherein the housing has a plurality of contact holes and the function expansion datacard further comprises:
   a board disposed on the housing, wherein the chips and the metal bracket are electrically connected to the board through the contact holes respectively.

7. The function expansion datacard according to claim 6, wherein the board is a thin metal plate for grounding the chips and the metal bracket.

8. The function expansion datacard according to claim 1, wherein the function expansion card is electrically connected to an electronic apparatus through the connector.

9. The function expansion datacard according to claim 1, wherein the function expansion datacard is a wireless communication modulator-demodulator (MODEM).

* * * * *